United States Patent
Cheema et al.

(10) Patent No.: US 8,945,297 B2
(45) Date of Patent: Feb. 3, 2015

(54) DIELECTRIC PROTECTIVE LAYER FOR A SELF-ORGANIZING MONOLAYER (SAM)

(75) Inventors: Tarik Cheema, Braunschweig (DE); Georg Garnweitner, Braunschweig (DE); Günter Schmid, Hemhofen (DE); Dan Taroata, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 236 days.

(21) Appl. No.: 13/391,175

(22) PCT Filed: Jul. 29, 2010

(86) PCT No.: PCT/EP2010/061044
§ 371 (c)(1),
(2), (4) Date: May 7, 2012

(87) PCT Pub. No.: WO2011/020685
PCT Pub. Date: Feb. 24, 2011

(65) Prior Publication Data
US 2012/0216713 A1      Aug. 30, 2012

(30) Foreign Application Priority Data
Aug. 17, 2009    (DE) .......................... 10 2009 037 691

(51) Int. Cl.
*C09D 1/00*         (2006.01)
*H01L 21/316*       (2006.01)
(Continued)

(52) U.S. Cl.
CPC ................ *H05K 1/162* (2013.01); *H01B 3/002* (2013.01); *H01B 3/10* (2013.01); *H01G 4/1227* (2013.01); *H01G 11/48* (2013.01); *B05D 1/185* (2013.01); *H05K 2201/0175* (2013.01); *H05K 2201/0195* (2013.01); *H05K 2201/0209* (2013.01); *H05K 2201/0224* (2013.01); *H05K 2201/0257* (2013.01); *Y02E 60/13* (2013.01)
USPC ............... 106/287.19; 106/287.18; 106/286.4

(58) Field of Classification Search
USPC .............................. 106/287.19, 286.4, 287.18
See application file for complete search history.

(56) References Cited

U.S. PATENT DOCUMENTS 7,498,662 B2    3/2009  Napierala
8,614,875 B2 *  12/2013 Schmid et al. ................ 361/313

(Continued)

FOREIGN PATENT DOCUMENTS

CN    101310368    11/2008
DE    10338465     3/2005

(Continued)

OTHER PUBLICATIONS

International Search Report for PCT/EP2010/061044, mailed on Oct. 4, 2010.

(Continued)

*Primary Examiner* — James McDonough
(74) *Attorney, Agent, or Firm* — Staas & Halsey LLP

(57) ABSTRACT

A dielectric protective layer has nanoparticles integrated therein to increase the dielectric constants. The nanoparticles are surrounded by a protective shell to prevent agglomeration, in order to maintain the small particle size, for depositing an extra-thin film.

10 Claims, 16 Drawing Sheets

(51) Int. Cl.
*C23C 16/40* (2006.01)
*H05K 1/16* (2006.01)
*H01B 3/00* (2006.01)
*H01B 3/10* (2006.01)
*H01G 4/12* (2006.01)
*H01G 11/48* (2013.01)
*B05D 1/18* (2006.01)

(56) References Cited

U.S. PATENT DOCUMENTS

| | | |
|---|---|---|
| 2003/0175411 A1 | 9/2003 | Kodas et al. |
| 2003/0219822 A1* | 11/2003 | Quinn et al. .................... 435/7.1 |
| 2005/0167660 A1 | 8/2005 | Klauk et al. |
| 2005/0189536 A1 | 9/2005 | Zschieschang et al. |
| 2006/0275201 A1 | 12/2006 | Niederberger et al. |
| 2008/0012163 A1 | 1/2008 | Andrews et al. |
| 2008/0131709 A1 | 6/2008 | Hanson et al. |
| 2011/0114925 A1* | 5/2011 | Hsu et al. ........................ 257/40 |
| 2014/0060900 A1 | 3/2014 | Schmid et al. |

FOREIGN PATENT DOCUMENTS

| | | |
|---|---|---|
| DE | 102004005082 | 8/2005 |
| DE | 102004009600 | 9/2005 |
| DE | 102004016131 | 10/2005 |
| DE | 10 2009 037 691.7 | 8/2009 |
| DE | 10 2009 016 659 | 6/2010 |
| WO | 03/016217 | 2/2003 |
| WO | 2008/118422 | 10/2008 |
| WO | 2009/086337 | 7/2009 |
| WO | PCT/EP2010/061044 | 7/2010 |

OTHER PUBLICATIONS

Yageo, Data Sheet Multilayer Ceramic Capacitors, http://us.100y.com.tw/pdf_file/CC-SeriesX7R.pdf, Product Specification—Aug. 13, 2006, vol. 6, 8pp.

Chinese Office Action for corresponding Chinese Application No. 201080046764.4; issued Feb. 27, 2014.

Chinese Office Action for related Chinese Patent Application No. 201080046764.4, issued Oct. 22, 2014, 11 pages.

* cited by examiner

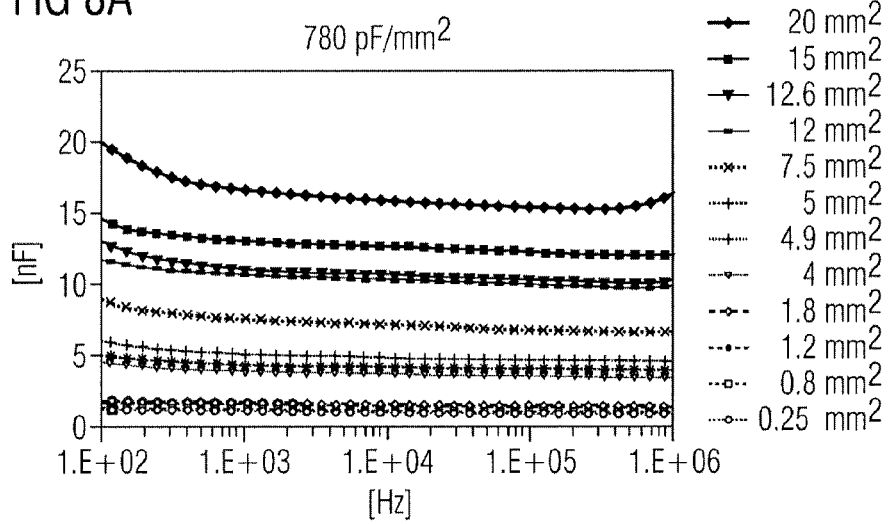
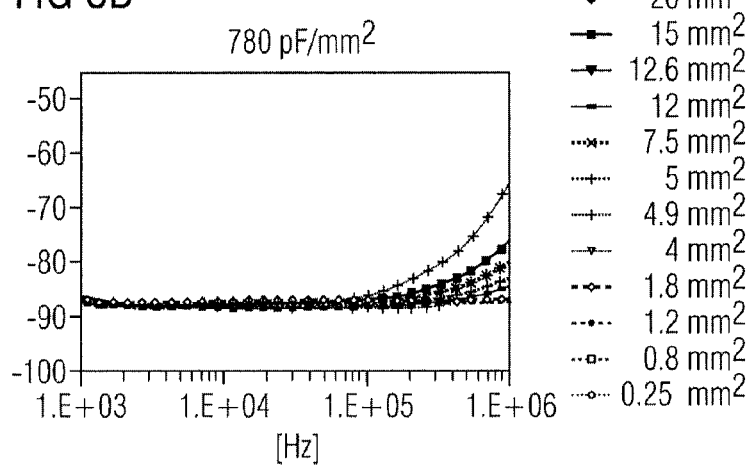

DIELECTRIC PROTECTIVE LAYER FOR A SELF-ORGANIZING MONOLAYER (SAM)

CROSS REFERENCE TO RELATED APPLICATIONS

This application is based on and hereby claims priority to International Application No. PCT/EP2010/061044 filed on Jul. 29, 2010 and German Application No. 10 2009 037 691.7 filed on Aug. 17, 2009, the contents of which are hereby incorporated by reference.

BACKGROUND

The invention relates to a protective layer and/or planarization layer for a self-assembling monolayer (SAM), as used in particular in circuit board fabrication, in the functionalization of copper blanks, as for example in the production of passive components such as capacitors and resistors.

The density of integration in circuit board fabrication goes up with increasing miniaturization, hence giving rise to the need for components, especially passive components such as resistors and capacitors, to be integrated directly into the circuit board. The space saving on transition to 3D population has a positive effect in turn on the costs situation.

Rising cycle frequencies in commodity products, such as computer main boards or cell phone circuit boards, in conjunction with data buses that are becoming ever broader, mean that there is an increased requirement for capacitive sinks in order to ensure reliable communication between the components (signal-to-noise ratio). While the ratio between capacitors and resistors was formerly at a level of 1:1, it has now risen to 3:1.

In order to increase the mechanical stability of the SAMs, which almost exclusively determine the leakage current characteristics of the components, such as the capacitors, for example, DE 10 2008 048 446 applies to the self-assembling monolayer, for the purpose of stabilization and/or for the local planarization of the capacitor or component, a supporting polymer, in other words a thin polymer layer. This layer is referred to below as a protective layer. Typically, with the known protective layers, an integration density of 50 pF/mm$^2$ is produced with a dielectric constant of 3.17 for an effective polymer layer thickness of approximately 550-600 nm, whereas for an integration density of 150 pF/mm$^2$ an effective layer thickness is 180-200 nm. A greater amount of polymer is introduced into the sinks, while the peaks carry a thinner polymer film (see FIG. 1).

For planarization, use has to date been made of any desired polymers as support polymers, provided they are compatible with the circuit board processes.

A disadvantage of the related art is the low dielectric constant of the protective layer, which in turn determines the integration density, which, as described above, ought to be increased for the purpose of miniaturization and for providing a broad capacitance spectrum.

SUMMARY

It is one possible object, therefore, to provide a dielectric protective layer for a self-assembling monolayer (SAM) that has an increased dielectric constant. While maintaining the thin-film concept, moreover, this protective layer is also, preferably, to be capable of being processed from solution. With the aid of this innovative protective layer it is possible to achieve integration densities of up to more than 10 nF/mm$^2$.

The inventors propose a protective layer for a self-assembling monolayer, comprising oxidic nanoparticles having a high dielectric constant, the oxidic nanoparticles having an average particle size of less than 50 nm and having a protective shell which stabilizes them against agglomeration and aggregation. The inventors further propose a component based on organic electronics, integrated into a circuit board, a prepreg or a blank, the blank, circuit board or prepreg serving as substrate, on which an organic compound is applied for a self-assembling monolayer having a protective layer in accordance with the subject matter of the invention. The inventors lastly propose a method for producing a stabilized nanoparticle by construction of a protective shell.

As a component based on organic electronics, suitability is possessed in particular by a capacitor. Furthermore, for example, organic field effect transistors, where the gate dielectric for organic field effect transistors is suitable for direct integration into the circuit board, or organic light-emitting diodes (OLEDs), where the electrodes for the OLED are deposited on the thin insulation, can be improved by the proposals, particularly since the copper layer for top-emitting OLEDs is hermetically tight. The term OLED also includes light-emitting electrochemical cells (LEECs).

Finally, in analogy to the construction for the OLEDs, the layer sequence can also be used for solar cells, and so components based on organic electronics that are contemplated include not only capacitors but also, at least, organic field effect transistors, OLEDs, and organic solar cells. In principle the proposal is suitable for all kinds of organically insulating interlayers.

In particular it is possible to construct a component, inexpensively, directly onto an acid-dipped, or pickled, copper surface. FIG. 1 shows one such construction, of a capacitor as an example.

Oxidic nanoparticles having an average particle size in this magnitude of below 50 nm are obtainable, for example, via a process known as sol-gel synthesis, which is known from documents including DE 103 38 465 and DE 10 2004 016131. In the methods described therein for producing the nanoparticles, nonaqueous alcohol solutions of metals, in particular, are prepared, and are reacted with hydroxide compounds and/or alkoxy compounds of a second metal, of higher valence, giving particles which have an average particle size of below 50 nm, and even in the range from 5 to 10 nm. In DE 10 2004 016 131, metal alkoxides and metal aryl oxides are reacted with an alcohol, and nanoparticles are likewise obtained. The disclosure content of the two cited publications is hereby incorporated herein by reference. The nonaqueous sol-gel synthesis makes it possible in particular to produce extremely small nanoparticles, <10 nm, of a wide variety of metal oxides, such as $TiO_2$, $ZrO_2$, and $BaTiO_3$, in high crystallinity and purity. At the same time the synthesis can be implemented inexpensively and permits high yields. With these techniques, however, highly agglomerated nanoparticles are obtained, which cannot be processed to thin films and hence to thin-film capacitors.

To prevent agglomeration and aggregation and to obtain very highly homogeneous distribution of the nanoparticles, they are provided, with an "organic protective shell", which protects them from aggregation.

Surprisingly, stabilizers have been found for forming a protective shell around the nanoparticles that does not affect the effective dielectric constant of the particles but hinders their agglomeration and hence enables their processing to thin films.

The stabilizers in question are, more particularly, organic compounds which lay themselves around the individual particles and, following the deposition of the thin film, stabilize the film by way of van der Waals interactions. According to one preferred embodiment, these organic compounds also comprise functional groups suitable for crosslinking, which stabilize the protective layer following deposition.

For the preparation of the stabilized nanoparticles they are subjected—for example, following the sol-gel synthesis—to a stabilizing treatment for the purpose of constructing a protective shell around the nanoparticles. In this case the nanoparticles are stirred in a solution of the stabilizer in a suitable solvent at room temperature for a plurality of hours to days. Subsequently they are subjected, for example, to a washing step, in order to remove excess stabilizer. In addition, a mechanical dispersing treatment may be performed in order to destroy agglomerates.

According to one preferred embodiment, the protective shell around the nanoparticles comprises carboxylic acids, polyethercarboxylic acids and/or phosphoric acid derivatives.

Following the deposition of the protective layers as film, the protective shell formed around the nanoparticles by these molecules, and composed of "stabilizers", stabilizes the film by way of van der Waals interactions.

Examples of suitable stabilizers for constructing the protective shell around the nanoparticles are as follows:

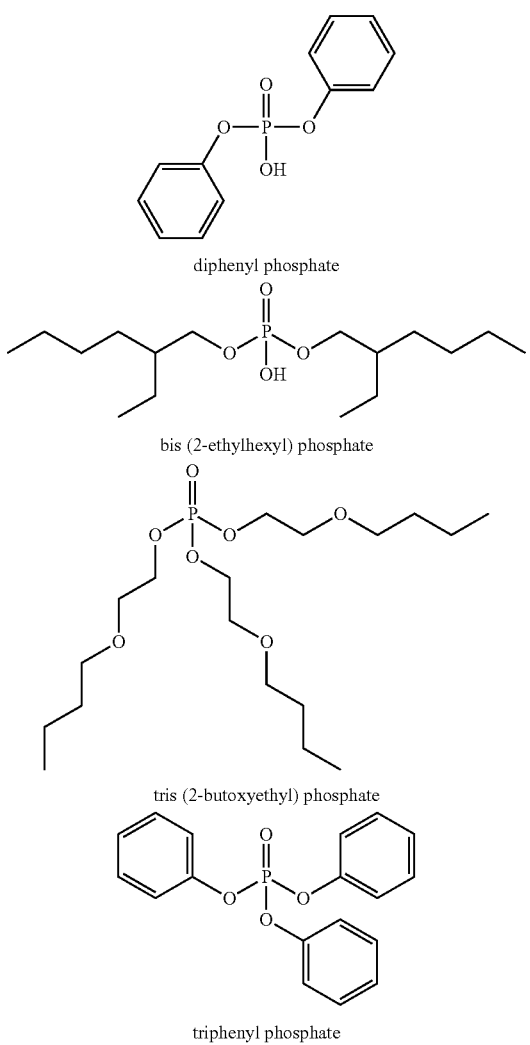

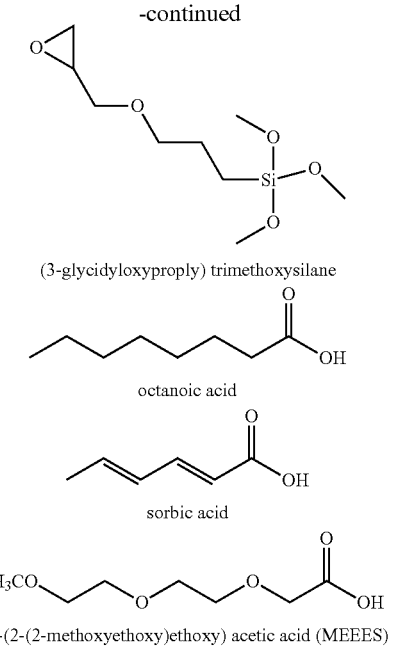

The following solvents, by way of example, may be used for cleaning the nanoparticles:

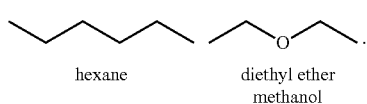

The following solvents, by way of example, may be used for dispersing the nanoparticles:

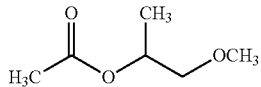

propylene glycol monomethyl ether acetate (PGMEA), ethanol, chloroform, tetrahydrofuran. According to one preferred embodiment a combination of MEEES and PGMEA is used.

According to one embodiment the nanoparticles are imbedded into a matrix, such as into a polymeric matrix, for example. Examples of suitable matrix materials include the compounds known for the support polymer from the related art, as for example from DE 10 2008 048 446, an example being poly-hydroxystyrene crosslinked by melamine-co-formaldehyde.

In addition to the novolak-like polymers it is also possible for resins based on epoxides, acrylates, urethanes or carbonates to be used as matrix polymers for the nanoparticles. Further polymers: polyesters, polyamides, polyimides, polybenzoxazoles, polyvinylidene difluoride (in general Teflon-like materials), polyvinyl compounds (carbazoles, alcohols, and esters thereof). Copolymers or block copolymers such as ABS are likewise suitable. The molar mass of the polymers may be situated in the range between 1000 and 1 000 000.

According to a further embodiment, the stabilized nanoparticles can be processed directly from the solution in which they have been prepared, even without polymeric matrix material. The working examples show that in this case mechanically stable films can likewise be deposited on the SAM.

According to one preferred embodiment, the deposition of the protective layer is carried out wet-chemically. In this case it may be accomplished via spin coating, centrifugal coating, printing, dipping, curtain coating or knife coating, with subsequent removal of the solvent.

Also possible is any other production of the protective layer, including, for example, by sputtering or electron beam evaporation methods.

The protective layer may be applied, for example, as follows:

a. from solution. For this purpose, 1%-50%, preferably 5%-20%, of the polymer, with or without crosslinker, is dissolved in an organic solvent (PGMEA=propylene glycol monoethyl ether acetate, tetrahydrofuran, dioxane, chlorobenzene, diethylene glycol diethyl ether, diethylene glycol monoethyl ether, gamma-butyrolactone, N-methylpyrrolidinone, ethoxyethanol, xylene, toluene, etc.) and applied in appropriate thickness by spin coating, printing (screen printing, inkjet printing, spraying, etc.). The solvent is subsequently evaporated by a heat-treatment step, leaving the dust-dry or cured polymer layer. The polymers may be crosslinked thermally or photochemically. Crosslinking is optional. For polyvinyl alcohol, for example, water is among the suitable solvents. Possible crosslinkers are photoacids.

PGMEA is one of the particularly preferred solvents, since numerous photoresists in the semiconductor and circuit board industry are based on this solvent. Accordingly, the formulations for the capacitors become plant-compatible as well.

b. In the case of acrylates and epoxides, the monomers or oligo compounds can be applied by spin coating or printing (see below) and subsequently crosslinked thermally or photochemically to form the dielectric.

Oxidic nanoparticles are, for example, nanoparticles based on ceramics and other inorganic materials such as $TiO_2$, $ZrO_2$, $BaTiO_3$, and $BaZrO_3$.

For the construction of the components based on organic electronics, the following layers are applied:

The component is constructed, for example, directly on a blank, as for example a copper blank produced by customary production methods, without this blank being functionalized by a further metal or planarized by special methods. The metal layer on which the anchor group of the SAM is applied is, accordingly, a copper layer or copper-containing layer, the fraction of copper in the layer being preferably above 10%, with more particular preference above 40%, and with very particular preference above 70%, measured in mol percent.

The base material used for the component, the capacitor, for example, is therefore a copper blank which has been acid-dipped by commonplace methods, and has an add-on of approximately 5-30 μm copper blank and a roughness in the μm range. Acid dipping may take place in the customary manner, by degreasing with organic solvents and subsequent incipient etching using peroxodisulfates and sulfuric acid. FIG. 2 visualizes the roughness of an acid-dipped circuit board substrate.

Additional cleaning of the copper surface may take place cathodically, as is usual in electroplating. For this purpose, in a dilute sodium carbonate solution, the substrate is connected as the cathode and is cleaned by the resultant hydrogen with a current flow of 10-100 $mA/cm^2$.

As a result of the acid dipping, the contact angle with respect to water is less than 5°. As a result of this the copper surface becomes very hydrophilic. As an anchor group for the SAM, a monolayer of an organic phosphoric acid is deposited. The phosphonic acid anchor group has proven extremely suitable especially for copper.

Preference is given to the long-chain phosphonic acids, such as decyl- to octadecylphosphonic acid, generally $CH_3$—$(CH_2)_n$—$PO(OH)_2$, where n=8-25, preferably n=18. The molecular chain may also take the form of a polyether chain (—O—$CH_2$—$CH_2$—O)$_m$, where m is between 1 and 20, preferably between 2 and 10. The contact angle with respect to water increases, following deposition of an octadecylphosphonic acid, to >130° for alkylphosphonic acids, and is therefore an indicator of the quality of deposition. The alkyl chains may also be wholly or partly fluorinated.

Alternatively, deposition may also take place via the phosphonic esters and/or salts thereof or other derivatives such as amines etc. The salts may be obtained directly in solution by addition of smaller or equivalent amounts of alkali (NaOH, KOH, ammonia or ammonium hydroxides).

An organic compound for a self-assembling monolayer (SAM) is thereafter applied. For this purpose, the SAM possesses at least the above-described anchor group for the first electrode layer, a linker group, and a head group for attachment to the following layers, with the anchor group, according to one preferred embodiment, comprising a phosphonic acid and/or a phosphonic acid derivative. This head group may be custom-tailored, or else may be absent.

The term "organic compound for a self-assembling monolayer" refers to the compounds above which are oriented in the layer because of a particular anchor group, so that a majority of the molecules are present in parallel and/or identically orientated in the layer. For example, DE 10 2004 005082 describes organic compounds of this kind which are able to form monolayers in the dielectric layer of a component based on organic electronics. The organic compounds that can be used may have very different head groups and/or anchor groups. Furthermore, numerous commercially available materials may find use and be employed for the production of coherent monolayers.

The head group used may comprise very simple branched or unbranched alkyl groups or alkenyl groups that are suitable for further reactions (i.e., crosslinking). For improving the attachment of the monolayer to the support layer, the head group may constitute a fluorine, nitrile, amino, ester, aldehyde, epoxy or acid function. In the case of fluorination, the head group might be formed of —$CF_3$, —$CHF_2$ or $CH_2F$.

The support layer is deposited onto the head group of the SAM. The deposition of the protective layer is, according to one preferred embodiment, carried out wet-chemically. This can be done via spin coating, centrifugal coating, printing, dipping, curtain coating or knife coating, with subsequent removal of the solvent.

Any other production of the protective layer, as for example via sputtering or electron beam evaporation methods, is also possible.

As outer electrodes for the component, such as for the capacitor, for example, it is possible to use any metal or alloy thereof, or conductive, metal-containing printing pastes. The outer electrode may also be composed of conductive oxides such as, for example, tin-doped indium oxide or aluminum-doped zinc oxide. Likewise suitable are organic conductors, such as PEDOT (polystyrenesulfonic acid-doped polydiethoxythiophene) or PANI (camphorsulfonic acid-doped polyaniline). Particularly preferred, however, are the metals utilized in the circuit board industry, namely copper, aluminum, nickel, gold, and silver, and/or an alloy thereof. Metal counterelectrodes applied over the full area may be subsequently patterned by etching and mechanical ablation techniques (laser) that are known to the skilled person. Where two or more capacitors are provided with a common counterelectrode, the deposition of the counterelectrode may also take place from the gas phase by shadow masks (see working examples).

The counterelectrodes may also be applied by electroless metallization, after local or full-area seeding. In principle it is possible to use all methods of the circuit board industry, since the dielectric after crosslinking is compatible with the customary media of the circuit board industry.

A description is given, for example, of capacitors which can be produced in a parallel operation on a prepreg or other common circuit board substrates. Subsequent to this, the prefabricated capacitor layer can be integrated into the circuit board, resulting in a space/costs gain for the surface of the circuit board.

The dielectric constant of the protective layer determines the integration density. According to one embodiment, nanoparticles with a size of less than 10 nm are integrated. Large particles in the several hundred nanometer or micrometer range, of the kind conforming to the related art, are unsuitable, since they cannot be used to produce the thin-film capacitors described herein. The proposals allow the production and processing of stabilized oxidic nanoparticles smaller than 50 nm; a preferred range is between 5 and 20 nm, and less than 10 nm with more particular preference.

Accordingly it is possible for the first time to obtain integration densities >10 nF/mm$^2$. State of the art are 10-40 pF/mm$^2$.

A direct comparison with the related art is described in the working examples. The functionality in principle has been demonstrated.

BRIEF DESCRIPTION OF THE DRAWINGS

These and other objects and advantages of the present invention will become more apparent and more readily appreciated from the following description of the preferred embodiments, taken in conjunction with the accompanying drawings of which:

FIGS. 8A-8D show the relationship between capacitance, the phase of the impedance, and the value of the impedance for a capacitor produced with an integration density of 780 pF/mm$^2$ and the frequency, the direct current applied, and the surface area of the capacitor electrode;

DETAILED DESCRIPTION OF THE PREFERRED EMBODIMENT

Figure 1:
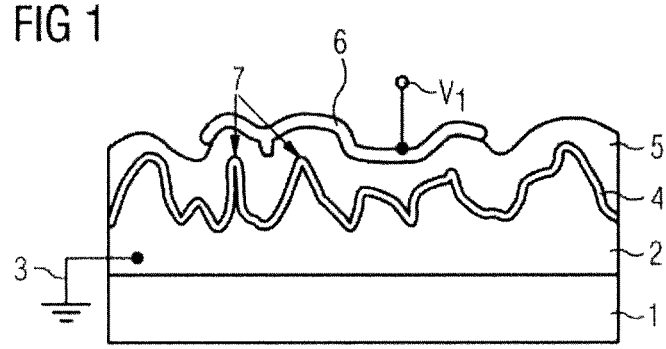
FIG. 1 shows a capacitor according to the inventors' proposals.

Reference will now be made in detail to the preferred embodiments of the present invention, examples of which are illustrated in the accompanying drawings, wherein like reference numerals refer to like elements throughout.

FIG. 1 shows a capacitor according to the inventors proposals.

Visible at the bottom is the prepreg 1, on which the metal for the lower, first electrode 2, with the connection 3, is located. Located on the first electrode is the insulating SAM layer 4, on which the inventors' proposal protective layer 5 has been applied. Atop this is the counterelectrode 6. The arrows 7 mark the locations with the critical E-fields.

Figure 2:
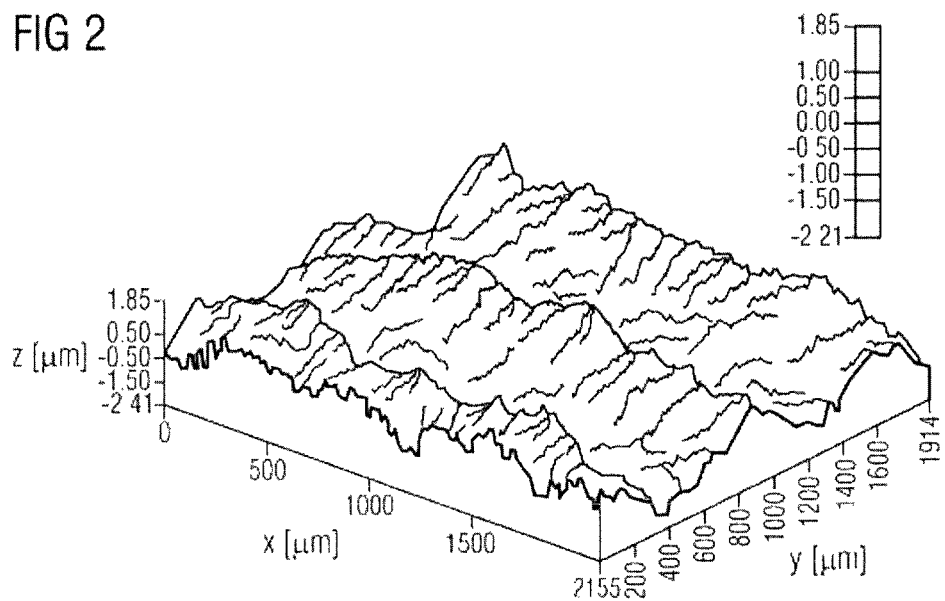
FIG. 2 shows the circuit board surface with a roughness in the region of 4 μm.

FIG. 2 shows the circuit board surface with a roughness in the region of 4 μm.

EXAMPLE 1

For the test setup, an FR4 blank laminated with 30 μm of copper is cut to a size of 50×50 mm$^2$. It is first of all freed from grease using acetone and isopropanol. A commercial photoresist is spun on at 6000 rpm for 20 s and dried on a hotplate at 110° C. for 60 s. The photoresist is exposed for 7 s with UV light with a wavelength of 365 nm, and developed for 60 s in aqueous-alkaline developer.

Following the photostructuring, an acid dip is carried out in a 5% ammonium peroxodisulfate solution at 40° C. for 3 min. After being rinsed with water and isopropanol, the blank is placed into a solution of octadecylphosphonic acid (0.2-0.25 g) in isopropanol (100 ml). After 12 hours, the blank is rinsed with isopropanol and dried in a stream of nitrogen at 100° C. for 1 min.

After the acid dipping, the contact angle with respect to water is 1° to 4°. Following the deposition of the octadecylphosphonic acid, the contact angle is 137°, suggesting excellent coverage of the copper layer.

Figure 3:
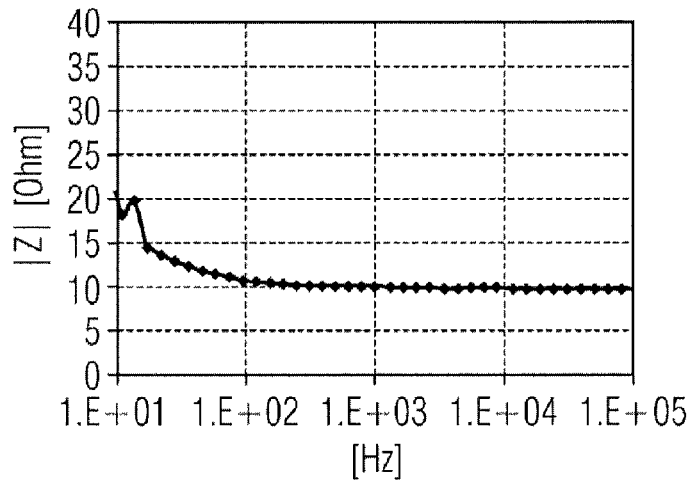
FIGS. 3 and 4 show all of the capacitors short-circuited.
Figure 4:
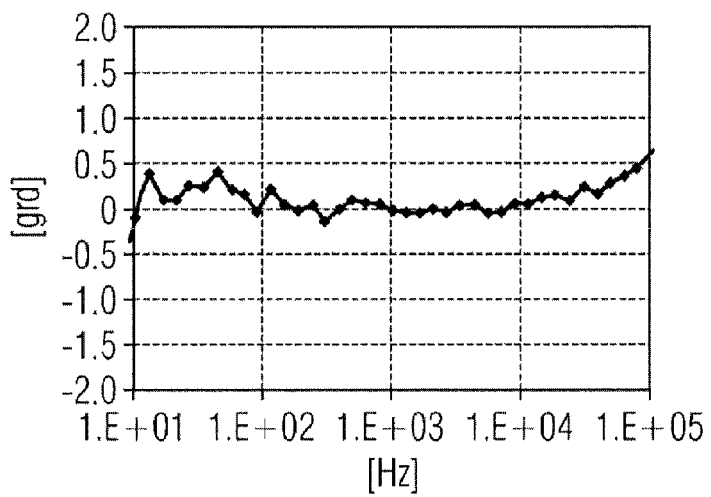

Subsequently 100 nm of aluminum are applied by vapor deposition through a shadow mask, as the counterelectrode. In this way, for example, a processed capacitance specimen was produced on an FR4 circuit board. The electrical characteristics (value about 10Ω and phase angle of the impedance about 0°) in FIGS. 3 and 4 show that all of the capacitors are short-circuited. It is evident that for standard circuit boards with a roughness in the µm range, without Ti or Al pretreatment and without the presence of an aromatic head group on the primer, the method from DE 10 2004 005082 B4 is not suitable for the construction of capacitors in high yield.

Further examples show that with an SAM it is possible to construct high-capacitance capacitors directly on copper even without a head group having π-π interaction, such a group being costly and inconvenient, in chemical terms, to introduce. The anchor group, i.e. the phosphonic acid group, is located directly on the copper surface.

EXAMPLE 2

Integration density 780 pF/mm$^2$ with $ZrO_2$ nanoparticle:

In the same way as for example 1, a copper-laminated FR4 circuit board is coated with the primer octadecylphosphonic acid.

$Zr(O-nPr)_4$ (70% by weight solution in 1-propanol) was utilized as a precursor for the production of $ZrO_2$ nanoparticle by the nonaqueous sol-gel method. The precursor was mixed with benzyl alcohol (BnOH; ≥99% p.a.) and reacted in a closed reactor at 220° C. for 4 days (in this regard, see Garnweitner et al., Small 2007, 3, 1626). This gave a suspension of nanoparticles in BnOH, from which the particles were isolated by a sequence of centrifuging and washing with EtOH and PGMEA. The nanoparticles obtained were initially highly agglomerated.

The agglomeration is eliminated, in accordance with the described embodiment, in the following way: following the synthesis, the $ZrO_2$ nanoparticles are subjected to surface modification with 2-(2-(2-methoxyethoxy)ethoxy)acetic acid (MEEES). This modification was performed as a simple mixing reaction, by stirring the particles in a solution of MEEES (concentration 0.33 mol/l) in PGMEA for 48 hours at room temperature. Following this procedure, remaining agglomerates were removed by centrifuging, and the excess of stabilizer was eliminated by precipitation of the nanoparticle dispersion from diethyl ether and redispersion in pure PGMEA. The nanoparticle dispersion had a solids content of 57 mg/ml (determined by gravimetric analysis at 600° C.), and the particles exhibited a particle size of about 3-5 nm, as ascertained by analytical ultracentrifugation, dynamic light scattering, and transmission electron microscopy (TEM) (see FIGS. 5 to 7, corresponding to images 6A to C). The drawings demonstrate the presence of individual particles in the dispersion, without larger agglomerates being present.

Figure 5:
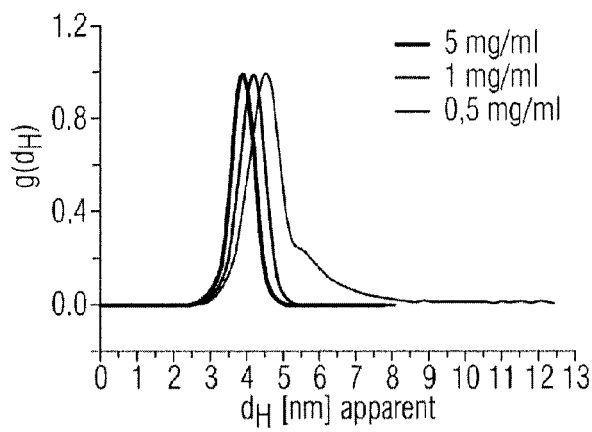
FIG. 5 shows the size measurement of the stabilized $ZrO_2$ nanoparticles in dilute dispersions in PGMEA, by analytical centrifugation.

FIG. 5 shows the size measurement of the stabilized $ZrO_2$ nanoparticles in dilute dispersions in PGMEA, by analytical centrifugation.

Figure 6:
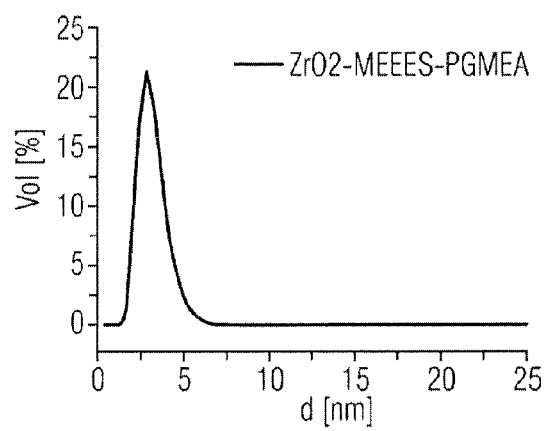
FIG. 6 shows the particle size measurement of the $ZrO_2$ dispersion in PGMEA by dynamic light scattering.

FIG. 6 shows the particle size measurement of the $ZrO_2$ dispersion in PGMEA by dynamic light scattering.

Figure 7:
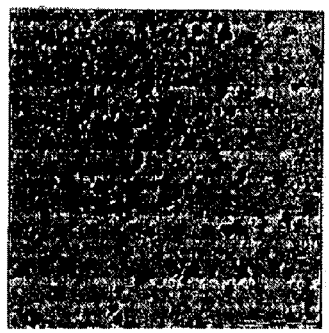
FIG. 7 shows a TEM micrograph of the $ZrO_2$ dispersion.

Lastly, FIG. 7 shows a TEM micrograph of the $ZrO_2$ dispersion.

The $ZrO_2$ nanoparticle dispersion prepared, with a concentration of 57 mg/ml, was spun on at a speed of rotation of 500 rpm for 30 s. Thereafter the sample was initially dried on a hotplate at 100° C. for 60 s and then treated in a vacuum oven at 120° C. to 180° C. for 20 min. After that, in the same way as in example 1, aluminum electrodes were deposited by vapor deposition (base pressure $1*10^{-6}$ mbar).

Figure 8C:
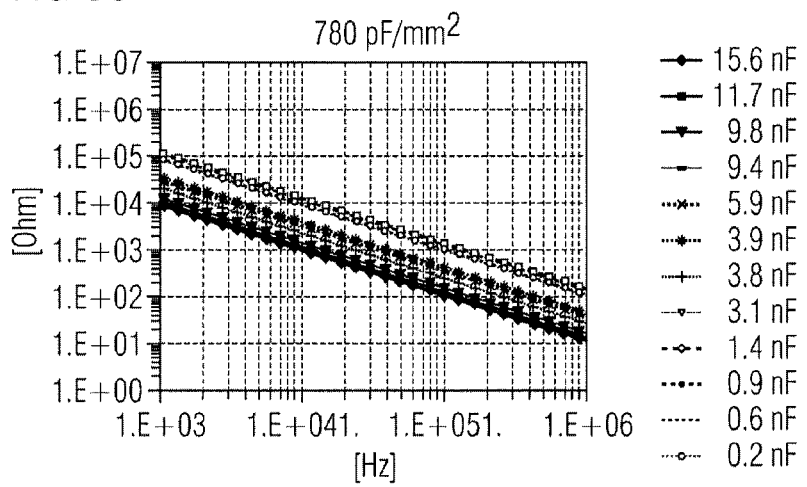
Figure 8D:
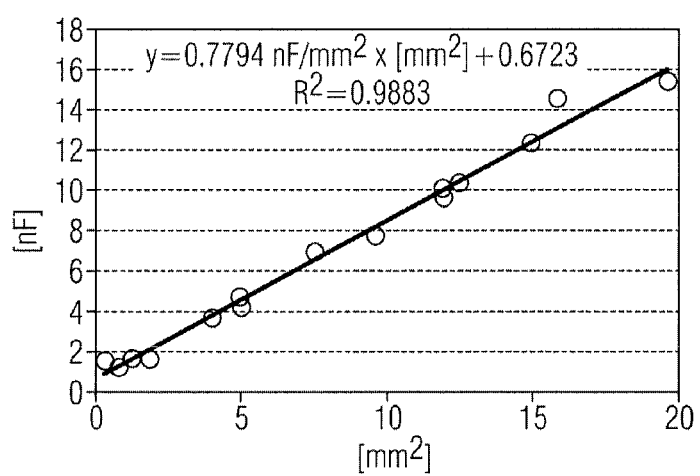

FIG. 8 shows the relationship between capacitance (a), the phase of the impedance (b), and the value of the impedance (c) for a capacitor produced with an integration density of 780 pF/mm$^2$ and (d) the frequency, the direct current applied, and the surface area of the capacitor electrode. This FIG. 8 illustrates the electrical properties of the capacitors produced. The capacitance measured shows no substantial dependency on frequency within the frequency range from 100 Hz to 1 MHz (see FIG. 8a). These properties are valid not only for low capacitor electrode surface areas, and low capacitance values, but are also retained for all of the surface areas tested (between 0.25 mm$^2$ and 20 mm$^2$), irrespective of electrode shape (round and angular electrode areas were tested). The linear dependence between electrode surface area and measured capacitance is shown in FIG. 8d at the frequency of 10 kHz, but is valid for all frequencies within the frequency range measured.

Figure 9:
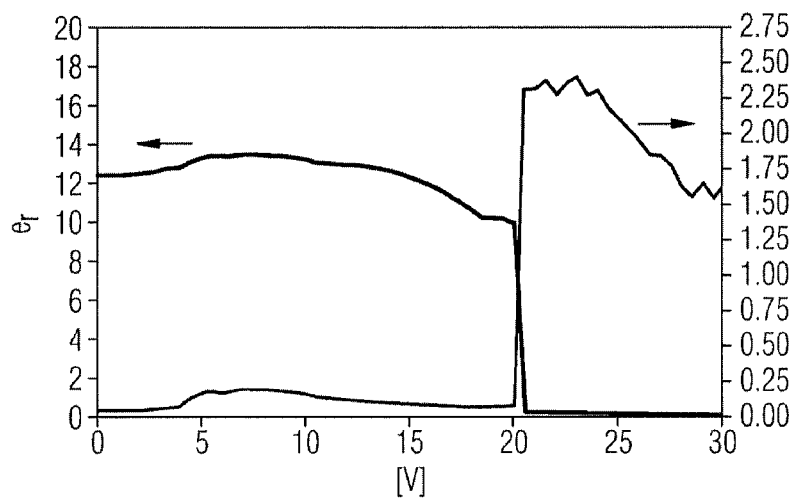
FIG. 9 shows the relationship of the relative dielectric constants for a capacitor having a capacitance of 7 nF with an integration density of 780 pF/mm$^2$.

Irrespective of the capacitance value, a breakdown voltage of 20 V-21 V was measured for the capacitor structure presented, corresponding to a breakdown field strength of 2 MV/cm. As an example, FIG. 9 shows the relationship of the relative dielectric constants for a capacitor having a capacitance of 7 nF with an integration density of 780 pF/mm$^2$. The good electrical properties of the capacitor are retained up to the point of the breakdown field strength. The loss factor measured corresponds to that of standard commercial SMD capacitors.

The dielectric constant of the material used was determined as follows. On account of the excessive roughness of the FR4 substrates (see FIG. 2), a precise determination of the dielectric thickness on this substrate is not possible. For this reason, capacitors were produced on a substrate with minimal roughness. For this purpose, glass substrates were selected as carriers. With the aid of a profilometer, the profile of a substrate of this kind was first of all examined.

Figure 10:
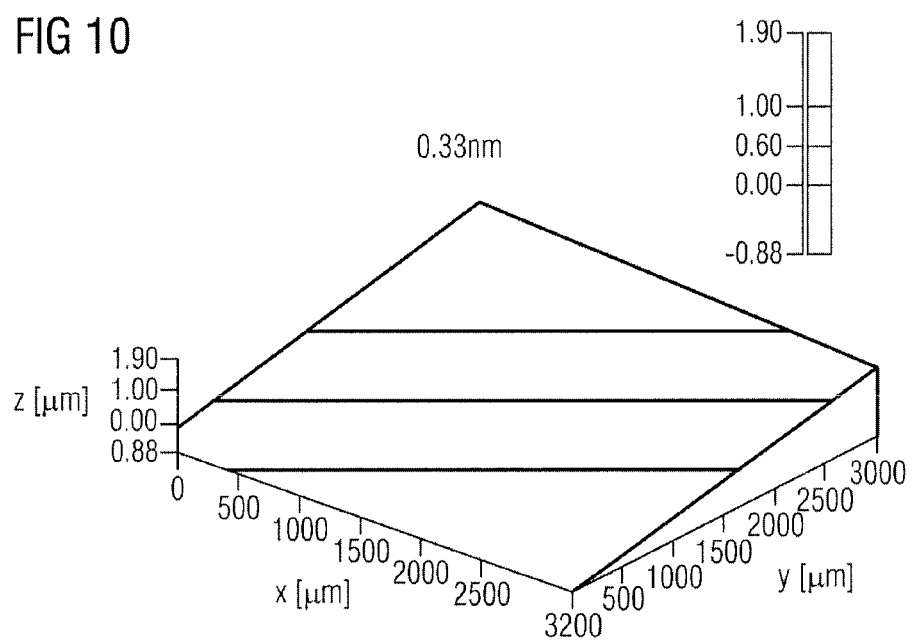
FIG. 10 shows the roughness lies within the range from 0.20 nm to 0.33 nm.

As can be seen in FIG. 10, the roughness lies within the range from 0.20 nm to 0.33 nm. For the further characterization of the capacitors, both electrodes were applied to the substrate by a vapor deposition process. The homogeneity of the vapor-deposited layers is shown in FIG. 11b.

Figure 11:
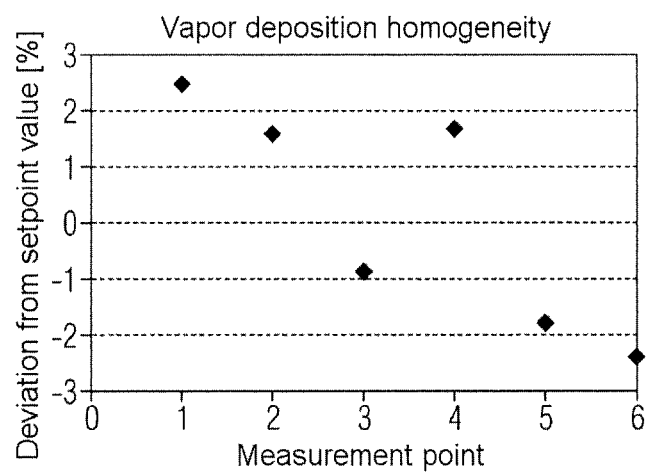
FIG. 11 shows the determination of the relative dielectric constant, especially deviations of the layer thickness from the setpoint value.

FIG. 11 shows the determination of the relative dielectric constant, especially deviations of the layer thickness from the setpoint value.

A copper layer 100 nm thick was applied by vapor deposition. The corners of the glass sample were taped off with Kapton tape as a shadow mask. After the vapor deposition process, the Kapton tape was removed and the layer thickness was measured using a profilometer.

Following the deposition of the SAM on the substrate (in the same way as in example 1), the $ZrO_2$ nanoparticle solution was applied by rotational coating (5.5% by weight $ZrO_2$ in PGMEA, 500 rpm rotational speed for 30 s). Prior to this processing step, the sample was again provided with Kapton tape at one corner. This created a defined step, from which it is possible to determine the thickness of the dielectric. The subsequent layer thickness measurement gave an effective mean thickness of 120 nm. With the aid of a further vapor deposition step, the upper electrode of the capacitors was produced.

Figure 12:
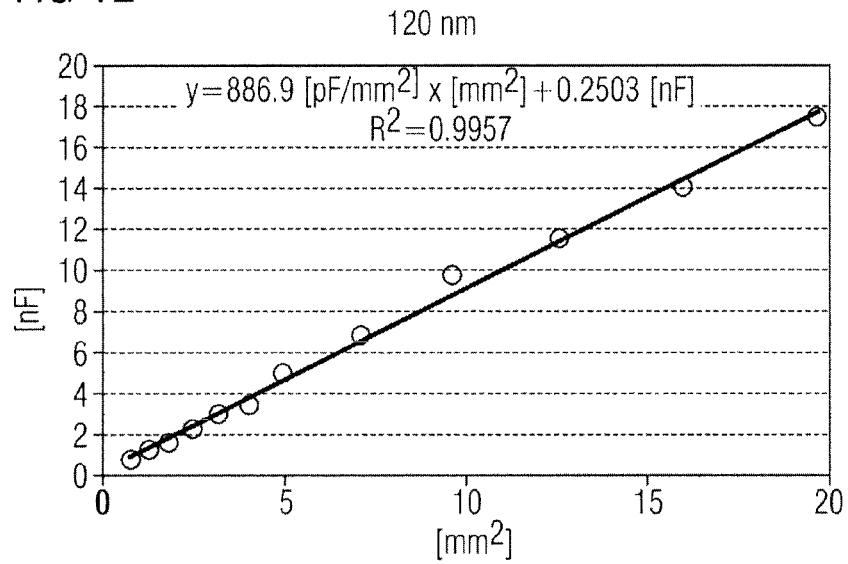
FIG. 12 shows the relationship between capacitance and electrode surface area for the capacitor construction produced on glass, for the purpose of determining the relative dielectric constant of the $ZrO_2$ nanoparticle layer.
Figure 13A:
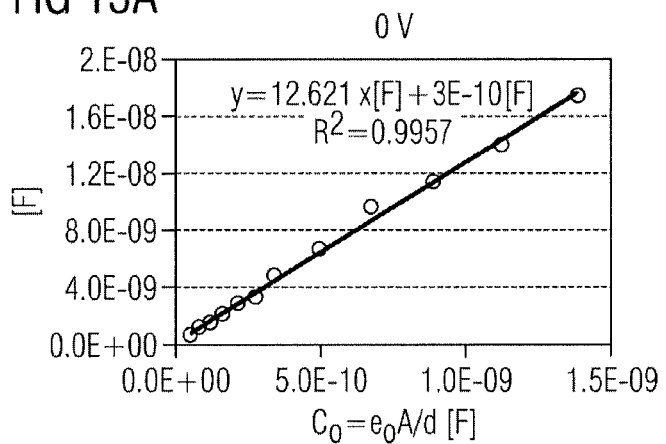
FIGS. 13A-13D show the measurement for determining the relative dielectric constants.
Figure 13B:
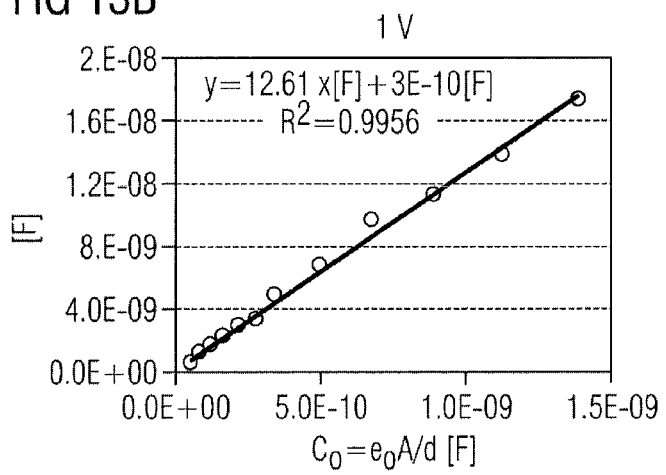
Figure 13C:
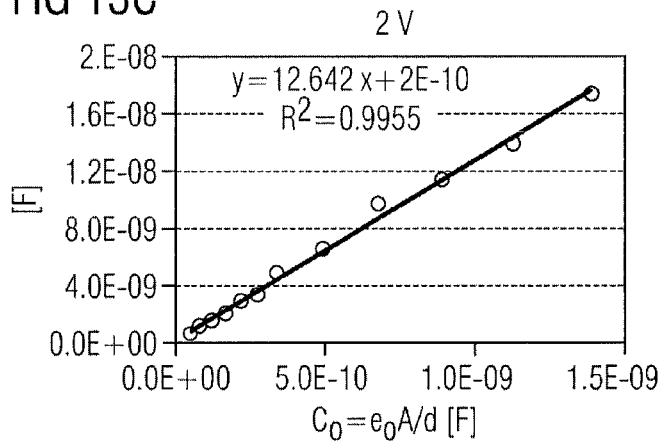
Figure 13D:
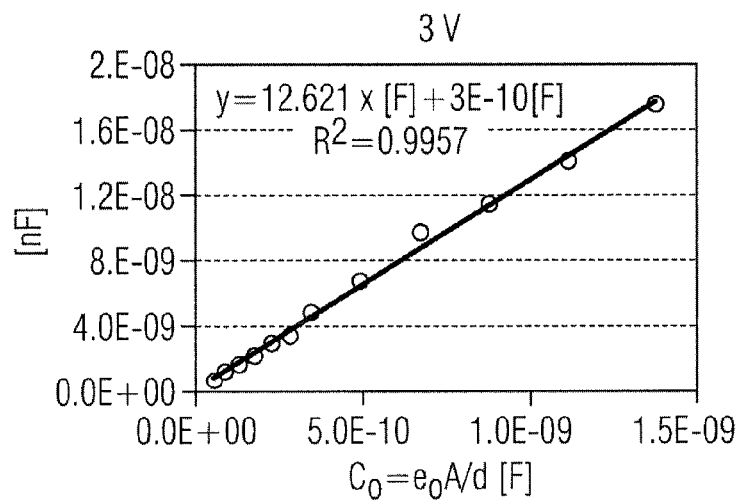

FIG. 12 shows the relationship between capacitance and electrode surface area for the capacitor construction produced on glass, for the purpose of determining the relative dielectric constant of the $ZrO_2$ nanoparticle layer.

By plotting of the measured capacitance as a function of the product of electrode area, dielectric constant for vacuum, and the reciprocal of the distance between the two capacitor plates (corresponding to the capacitance of a capacitor of equal geometry with a relative dielectric constant of 1), it is possible to determine, graphically, the relative dielectric constant.

FIG. 13 shows the measurement for determining the relative dielectric constants.

For the relative dielectric constant, a value of 12.62±0.02 was calculated by the measurements described, taking account of the measurement uncertainties.

EXAMPLE 3

Integration density 900 pF/mm² $ZrO_2$ nanoparticle.

In the same way as for example 1, a copper-laminated FR4 circuit board is coated with the primer octadecylphosphonic acid. The nanoparticles were produced in the same way as for example 2.

A $ZrO_2$ nanoparticle solution with a concentration of 57 mg/ml was spun on at a rotary speed of 750 rpm for 30 s. Thereafter the sample was initially dried on a hotplate at 100° C. for 60 s, and then treated in a vacuum oven at 120° C. to 180° C. for 20 min. Following that, in the same way as for example 1, aluminum electrodes are deposited by vapor deposition (base pressure $1*10^{-6}$ mbar).

Figure 14A:
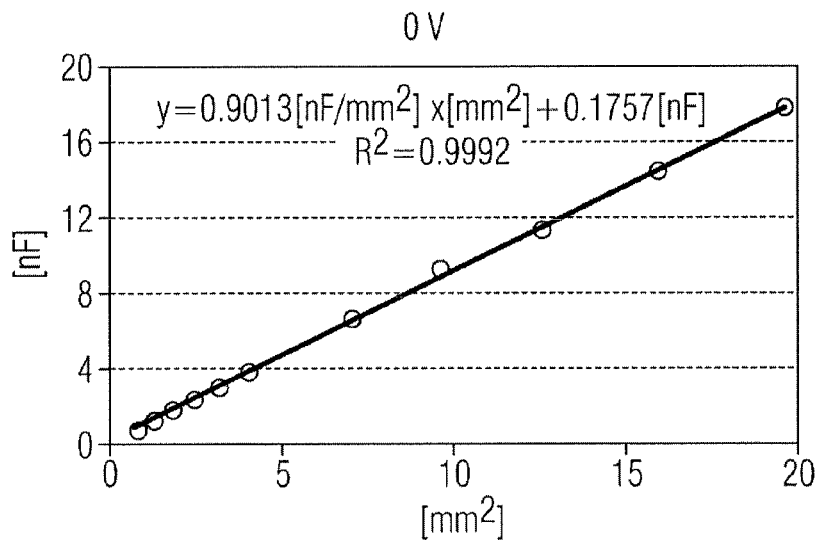
FIGS. 14A-14D show the linear dependence of the capacitance on the electrode area with an integration density of 900 pF/mm$^2$.
Figure 14B:
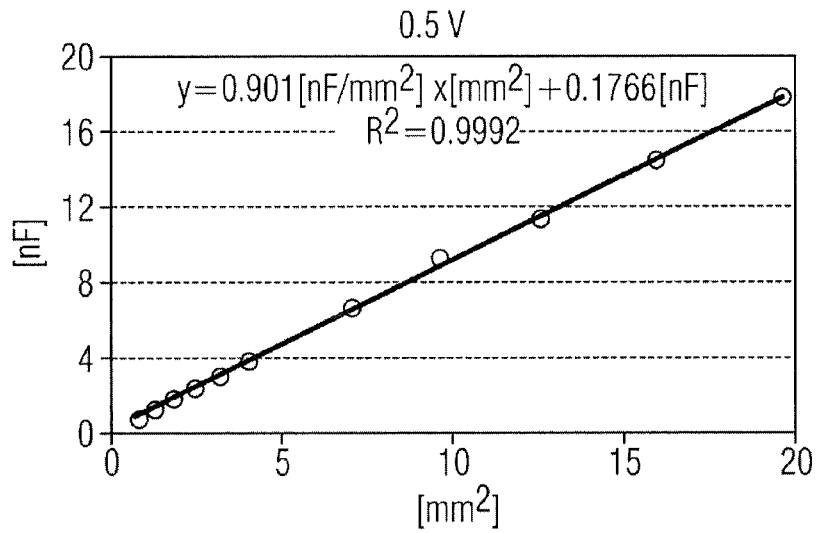
Figure 14C:
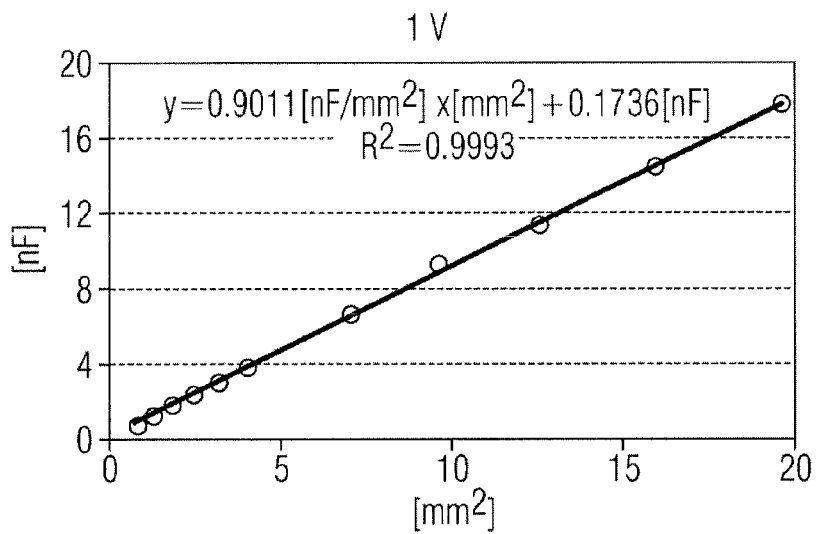
Figure 14D:
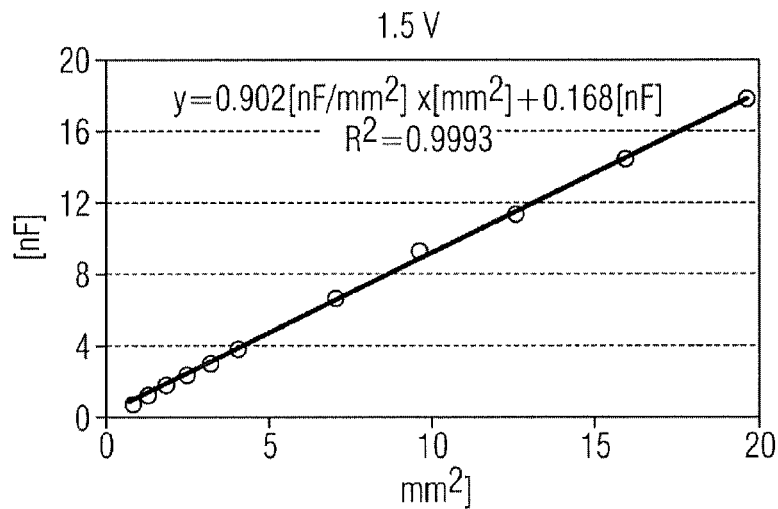

The linear dependence between the measured capacitance and the electrode area, at a frequency of 100 kHz, is shown for bias voltages of up to 1.5 V in FIG. 14a) to d). Accordingly, FIG. 14 shows the linear dependence of the capacitance on the electrode area with an integration density of 900 pF/mm².

FIG. 15 shows the dependence of the capacitance (a), the phase of the impedance (b), and the loss factor (c) of a capacitor produced, with the integration density of 900 pF/mm², (d) on the frequency and applied direct voltage.

Figure 15A:
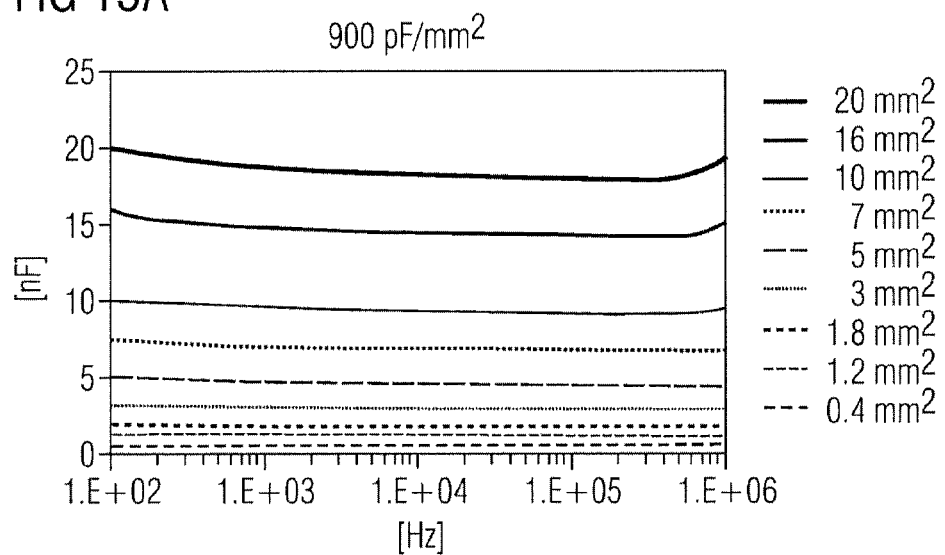
FIGS. 15A-15D shows the dependence of the capacitance, the phase of the impedance, and the loss factor of a capacitor produced, with the integration density of 900 pF/mm$^2$, on the frequency and applied direct voltage.

The yield of functional samples on substrates was >>90% (1000 capacitors were measured). FIG. 15a) shows the frequency-independent behavior of the capacitance of capacitors having electrode areas of between 0.25 mm² and 20 mm². For this reason, the very good linear dependence of the capacitance on the electrode area is retained for all frequencies in the measured range 100 Hz-1 MHz, independently of the bias voltage until breakdown.

Figure 15B:
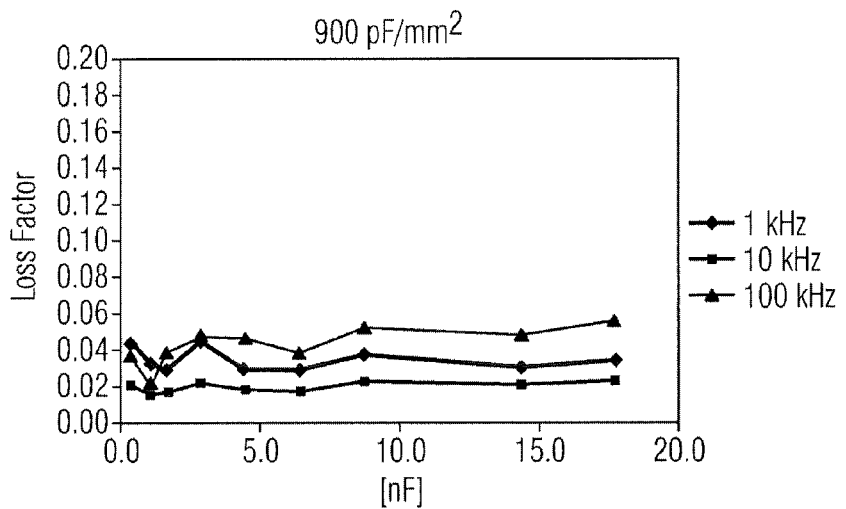
Figure 15C:
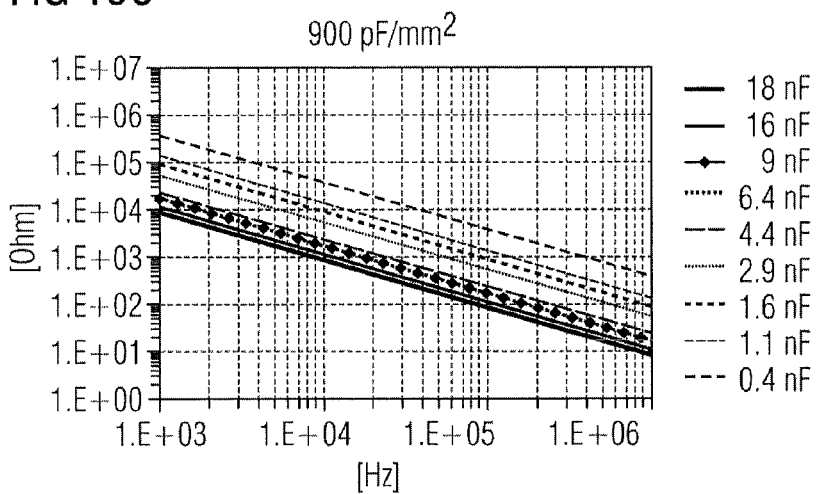

The loss factor is situated in the range of 0.008-0.05 and, as shown by FIG. 15b), is likewise virtually independent of the frequency, or the capacitance. Accordingly, the electrical properties of the capacitor presented are comparable, in relation to the loss factor as well, with those of standard commercial SMD capacitors (X7R class).

²www.yageo.com—Yageo Multilayer Ceramic Capacitors—Datas-heet (http://us.100y.com.tw/pdf_file/CC-SeriesX7R.pdf)

Figure 15D:
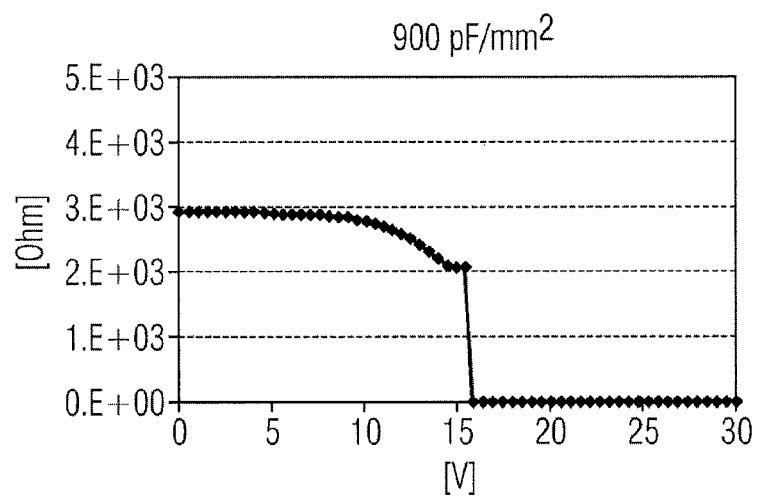

FIG. 15d) shows the breakdown behavior measured for capacitors with an integration density of 900 pF/mm². The breakdown voltage is between 16 V and 18 V, and this, in the same way as for example 2, corresponds to a breakdown field strength of up to 2 MV/cm. The measurement results are substantially independent of the capacitance and hence of the electrode area.

Other integration densities can be set through a suitable choice of the parameters (e.g., rotary speed in the case of rotational coating) during the coating operation.

Figure 16:
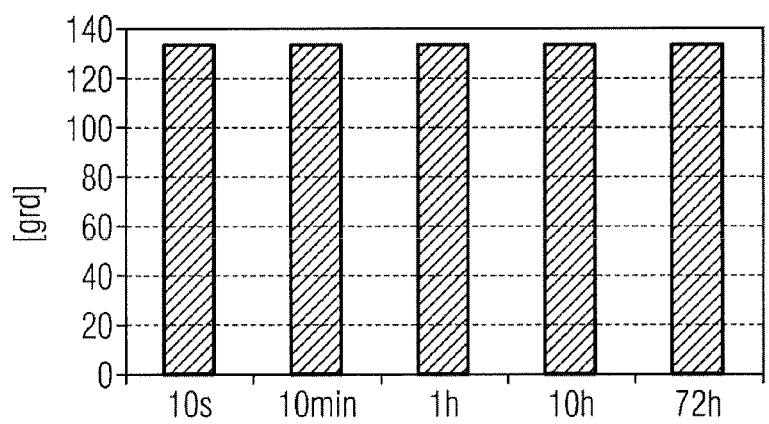
FIG. 16 shows that the process has a low level of dynamism.

The quality of the SAM layer deposited is the basis on the one hand for the good insulation properties and on the other hand for a good yield of the capacitors produced. FIG. 16 shows the relationship between the contact angle measured following SAM coating of the circuit board, and the time of placement of the sample in the solution.

In FIG. 16 it can be seen that the process has a low level of dynamism. After a placement time of 10 seconds, the contact angle is smaller only by 1.1° than after 10 minutes, and 1.9° smaller than after an hour. The angle then remains, after repeated measurements, at an average value of 135°±0.8°, even after a placement time of 72 hours of the samples in the SAM solution.

Figure 17:
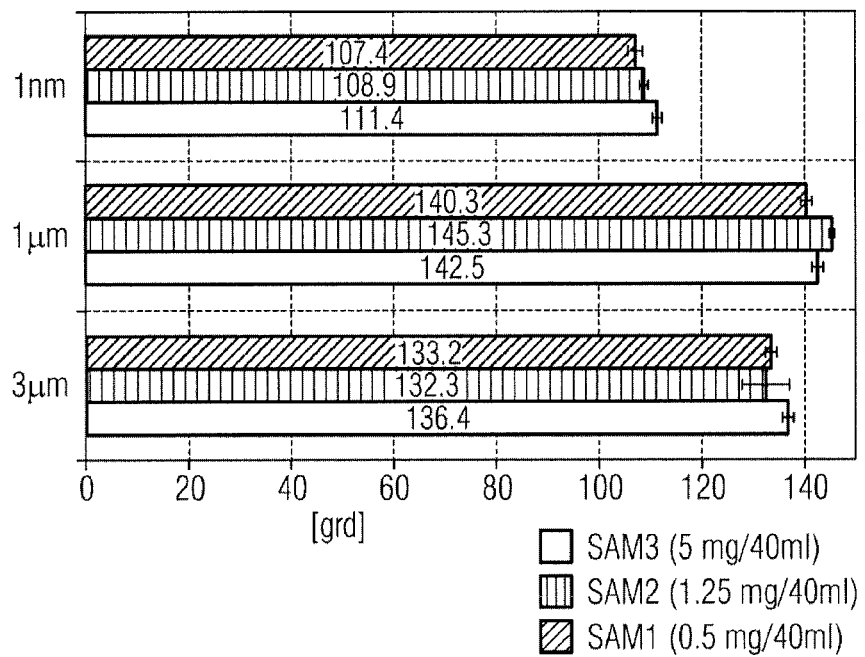
FIG. 17 shows the dependence of the measured contact angle after SAM deposition on the solution concentration (5 mg, 1.25 mg, and 0.5 mg SAM/40 ml solvent) and on substrate roughness.

The monolayer can be deposited from a solution of very low concentration, without impairing the quality of the layer. FIG. 17 shows the dependence of the measured contact angle after SAM deposition on the solution concentration (5 mg, 1.25 mg, and 0.5 mg SAM/40 ml solvent) and on substrate roughness.

EXAMPLE 4

Integration Density 10 nF/mm² with $BaTiO_3$ Nanoparticle

In the same way as for example 1, a copper-laminated FR4 circuit board is coated with the primer octadecylphosphonic acid.

Ba (99%) and Ti(O-iPr)₄ (97%) were utilized as precursors for the production of $BaTiO_3$ nanoparticle by the nonaqueous sol-gel method. Ba was dissolved in 10 ml of benzyl alcohol (BnOH; ≥99% p.a.) at about 70° C. and then, in a Teflon vessel, the Ba solution and, in a molar ratio of 1:1, Ti(O-iPr)₄ and 10 ml of BnOH were added. The whole was reacted in a closed reactor at 200° C. for 3 days. This gave a suspension of nanoparticles in BnOH, from which the particles were isolated by a sequence of centrifugation and washing with EtOH and PGMEA. The nanoparticles obtained were highly agglomerated to start with. The agglomeration can be eliminated as follows, and stabilized: the $BaTiO_3$ nanoparticles, after the synthesis, are subjected to a surface modification with 2-(2-(2-methoxyethoxy)ethoxy)acetic acid (MEEES). This modification was carried out as a simple mixing reaction, by stirring the particles in a solution of MEEES (concentration 0.33 mol/l) in PGMEA for 48 hours at room temperature. Following this procedure, remaining agglomerates were removed by centrifuging, and the excess of stabilizer was eliminated by precipitation of the nanoparticle dispersion from n-hexane and redispersing in pure PGMEA. The nanoparticle dispersion had a solids content of 55.5 mg/ml (determined by gravimetric analysis at 600° C.).

The $BaTiO_3$ nanoparticle dispersion prepared, with a concentration of 55.5 mg/ml, was spun on at a rotary speed of 800 rpm for 20 s. Subsequently the sample was predried on a hotplate at 100° C. for 60 s and then treated in a vacuum oven at 120° C. to 180° C. for 30 min. After that, in the same way as in example 1, aluminum electrodes were deposited by vapor deposition (base pressure $1*10^{-6}$ mbar).

Figure 18:
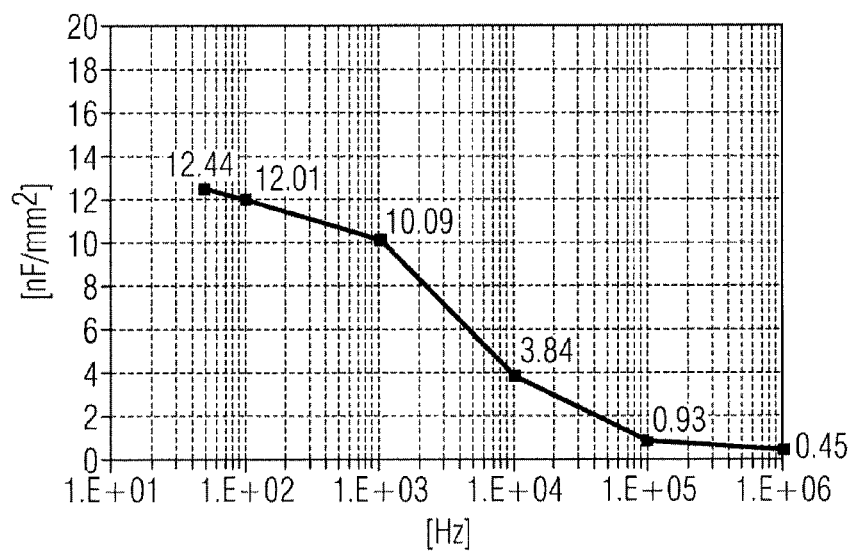
FIG. 18 shows the frequency profile of the integration density.

FIG. 18 shows the frequency profile of the integration density. In the lower frequency range up to 1 kHz it is possible to achieve integration densities >10 nF/mm², which represents a factor of 1000 in comparison to the related art.

The determination of the relative dielectric constants of the material was carried out as in example 2. For this purpose, a copper layer 100 nm thick was vapor-deposited on a 50×50 mm glass substrate, with a roughness <1 nm. The corners of the glass sample were taped off with Kapton tape as a shadow mask. Following the vapor deposition, the Kapton tape was removed and the layer thickness was measured using a profilometer. Following the deposition of the SAM on the substrate (in the same way as for example 1), the $BaTiO_3$ nanoparticle solution was applied by rotational coating (5.7% by weight $BaTiO_3$ in PGMEA, 500 rpm rotational speed for 20 s). Before this processing step, the sample was again provided with Kapton tape at one corner. This created a defined step, from which it is possible to determine the thickness of the dielectric. The subsequent layer thickness measurement resulted in an effective mean thickness of 345 nm. Using a further vapor deposition step, the upper electrode of the capacitors was produced.

By the plotting of the measured capacitance as a function of the product of electrode area, dielectric constant for vacuum, and the reciprocal of the distance between the two capacitor plates (corresponding to the capacitance of a capacitor of equal geometry with a relative dielectric constant of 1), it is possible to determine, graphically, the relative dielectric constant.

Figure 19:
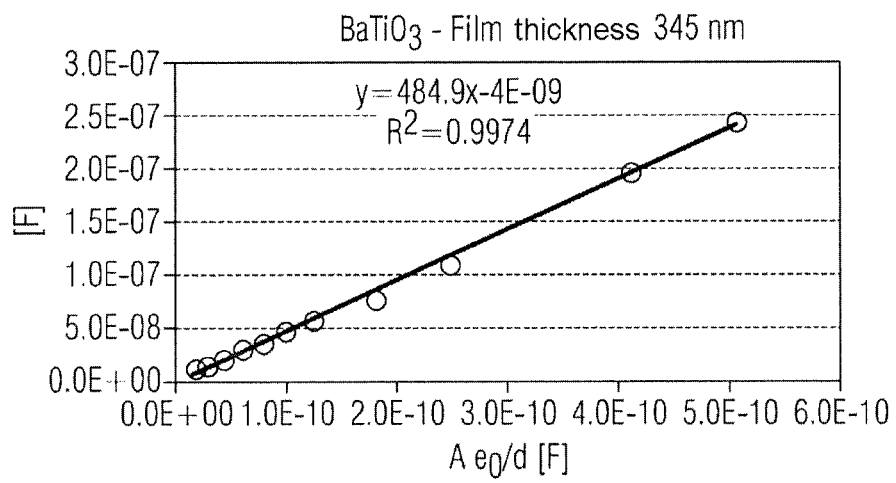
FIGS. 19, 20 and 21A and 21B show the correlation between capacitance and electrode area at 50 Hz (A), 100 Hz (B), and 1 MHz (C) and the frequency profile of the relative dielectric constants in the frequency range 50 Hz-1 MHz (D).
Figure 20:
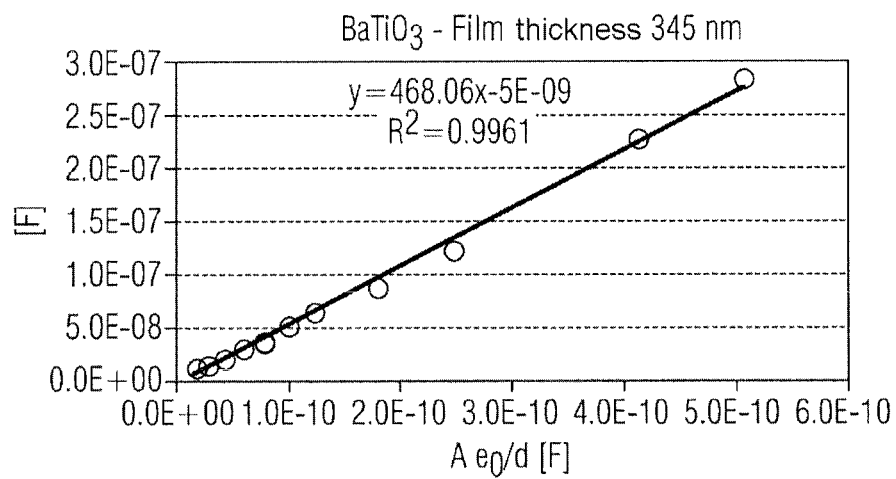
Figure 21A:
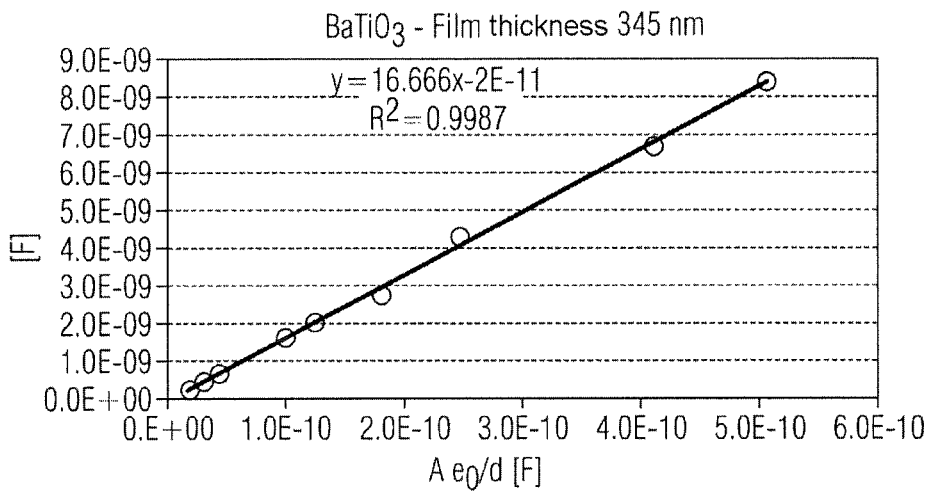
Figure 21B:
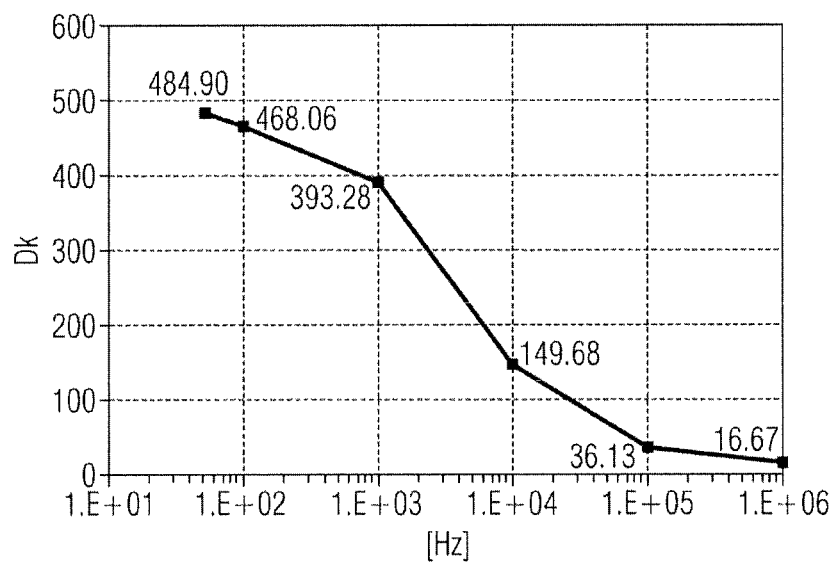

FIG. 19 shows the correlation between capacitance and electrode area at 50 Hz (A), 100 Hz (B), and 1 MHz (C) and the frequency profile of the relative dielectric constants in the frequency range 50 Hz-1 MHz (D).

EXAMPLE 5

In the same way as for examples 2 and 3, hexadecylphosphonic acid is also suitable.

EXAMPLE 6

In the same way as for examples 2 and 3, a prepreg is also suitable.

EXAMPLE 7

To obtain the adhesive properties of the prepreg, a photochemically crosslinking epoxy resin is used.

EXAMPLE 8

The photocrosslinking from example 5 is carried out via a shadow mask. After the removal of the noncrosslinked regions by washing, defined dielectric regions remain. Contacts are exposed.

EXAMPLE 9

The counterelectrode from examples 2-6 is realized in copper.

EXAMPLE 10

The copper electrode from example 7 is produced by sputtering.

EXAMPLE 11

The polymer layer is realized in ABS. In accordance with standard methods, this ABS layer is seeded and structured with palladium, and the outer electrodes of copper are deposited.

EXAMPLE 12

Instead of copper, nickel is used in example 9.
The proposals yield for the first time a capacitor which thousands of capacitors can be produced simultaneously by parallel processing.
The capacitor is very robust and reliable.
It can be produced either on a standard circuit board or on a prepreg.
The construction height is negligible by comparison with the roughness of the substrate material.
The capacitance/area integration density is very high.
The envisaged construction of an electrode layer with a subsequent insulator layer can of course be used advantageously not only in a capacitor, but is in principle also suitable for the following applications: as 1. A gate dielectric for organic field-effect transistors for direct integration into the circuit board.

2. A substrate for top-emitting OLEDs (the copper layer is hermetic). The electrodes for the OLEDs can then be deposited on the thin insulation.

3. Analogously to the construction for the OLEDs, the layer sequence is also suitable for solar cells.

A dielectric protective layer, for the purpose of increasing the dielectric constant, has nanoparticles incorporated therein. In order to obtain a low particle size for the deposition of ultrathin films, the nanoparticles are surrounded by a protective shell against agglomeration.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV,* 69 USPQ2d 1865 (Fed. Cir. 2004).

The invention claimed is:

1. A protected device comprising:
    a self-assembling monolayer (SAM);
    a protective layer for the self-assembling monolayer, the protective layer comprising oxidic nanoparticles having a high dielectric constant, the oxidic nanoparticles having an average particle size of less than 50 nm, the oxidic nanoparticles having a protective shell which stabilizes the oxidic nanoparticles against agglomeration and aggregation; and
    a counter electrode provided on the protective layer.

2. The protected device as claimed in claim 1, wherein the nanoparticles are formed of an inorganic material.

3. The protected device as claimed in claim 2, wherein the nanoparticles are formed of a ceramic material.

4. The protected device as claimed in claim 1, wherein the nanoparticles are formed of at least one material selected from the group of consisting of $TiO_2$, $ZrO_2$, $BaTiO_3$, and $BaZrO_3$.

5. The protected device as claimed in claim 1, wherein the protective shell for the nanoparticles is formed of an organic compound.

6. The protected device as claimed in claim 1, wherein the protective shell for the nanoparticles is formed of at least one material selected from the group consisting of carboxylic acids, polyethercarboxylic acids and phosphoric acid derivatives.

7. The protected device as claimed in claim 1, wherein the protective shell is formed from at least one stabilizer selected from the group consisting of:

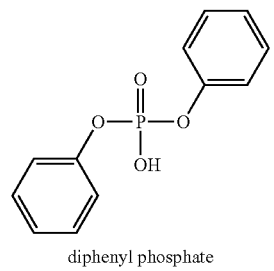

diphenyl phosphate

-continued

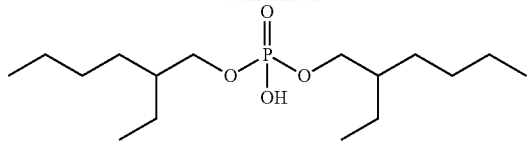
bis(2-ethylhexyl) phosphate

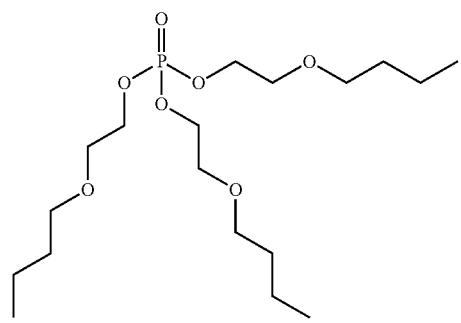
tris(2-butoxyethyl) phosphate

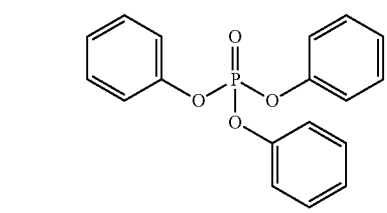
triphenyl phosphate

-continued

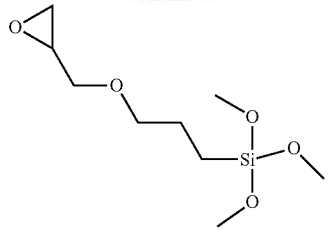
(3-glycidyloxypropyl)trimethoxysilane

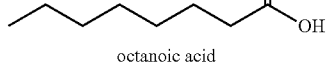
octanoic acid

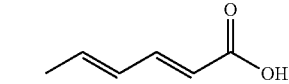
sorbic acid

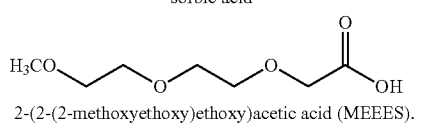
2-(2-(2-methoxyethoxy)ethoxy)acetic acid (MEEES).

8. The protected device as claimed in claim 1, wherein the nanoparticles are imbedded into a matrix.

9. The protected device as claimed in claim 1, wherein the oxidic nanoparticles have a dielectric constant greater than 3.17.

10. The protected device as claimed in claim 1, wherein the self-assembling monolayer (SAM) is formed on a first electrode such that the protected device functions as a capacitor.

* * * * *